United States Patent [19]

Yokoyama

[11] 4,451,798
[45] May 29, 1984

[54] GAIN-CONTROLLED AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 408,130

[22] Filed: Aug. 13, 1982

[30] Foreign Application Priority Data

Aug. 14, 1981 [JP] Japan .................. 56-127543

[51] Int. Cl.³ .................. H03F 3/45; H03G 3/20
[52] U.S. Cl. .................. 330/254; 330/279; 330/85
[58] Field of Search ............ 330/252, 254, 259, 260, 330/261, 278, 279, 85

[56] References Cited

U.S. PATENT DOCUMENTS

4,396,891  8/1983  Johansson et al. .............. 330/254

Primary Examiner—James B. Mullins
Assistant Examiner—G. Wan
Attorney, Agent, or Firm—Cushman, Darby & Cushman

[57] ABSTRACT

A gain-controlled amplifier having a gain which varies exponentially with a control voltage magnitude applied thereto comprises first and second transistor pairs, a driver circuit, a feedback circuit and a subtraction circuit. The first transistor pair comprises first and second transistors, and the second transistor pair comprises third and fourth transistors, all of the transistors being of the same conductivity tape. The emitters of the respective transistor pairs are joined together, the bases of the first and third transistors and the bases of the second and fourth transistors are joined together, respectively, and the two joined bases serve as input terminals of a control voltage. The driver circuit drives each of the joined emitters in opposite phase relation to each other in accordance with an input signal of the amplifier, the gain of the amplifier being controlled by the control voltage magnitude. A difference of the collector currents of the respective first and third transistors is used to effect a negative feedback of the amplifier, while a difference of the collector currents between the respective second and fourth transistors is used to deliver an output signal of the amplifier through the subtraction circuit.

10 Claims, 6 Drawing Figures

FIG. 1

PRIOR ART

GAIN-CONTROLLED AMPLIFIER

BACKGROUND OF THE INVENTION (a) Field of the Invention

The present invention relates to a gain-controlled amplifier the gain of which varies exponentially in response to a linear variation of a control voltage applied to the amplifier.

(b) Description of the Prior Art

Figure 1:
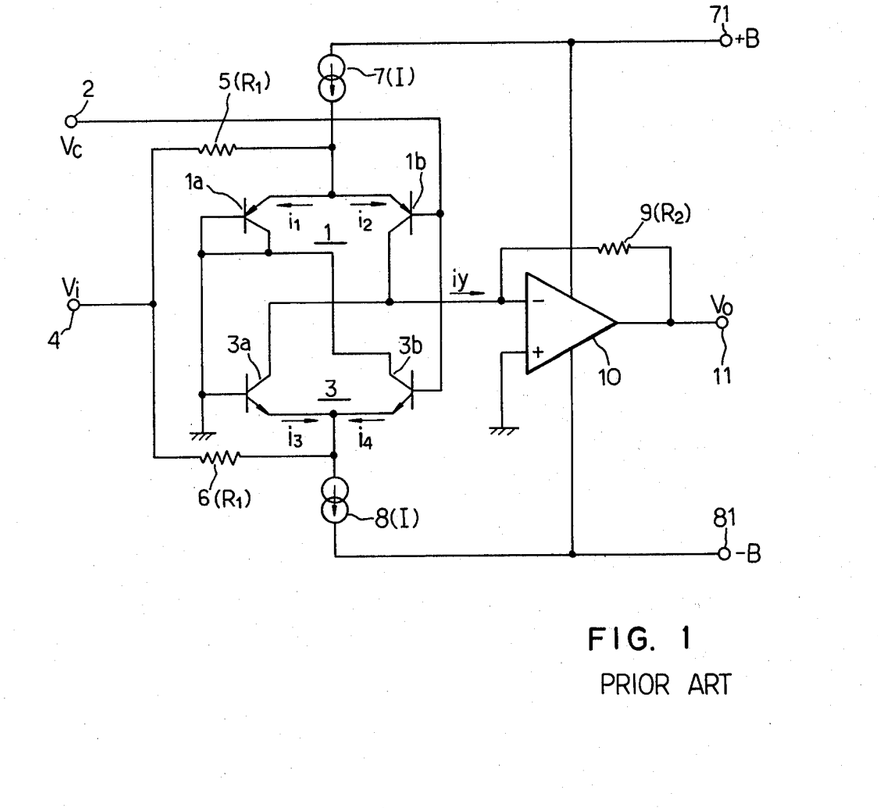
FIG. 1 is a schematic circuit diagram of a prior art typical gain-controlled amplifier.

One of a typical circuit arrangement of a conventional gain-controlled amplifier is illustratively shown in FIG. 1, wherein the gain-controlled amplifier comprises: a first pair of bipolar transistors $1a$ and $1b$ (PNP type), a second pair of bipolar transistors $3a$ and $3b$ (NPN type), and an operational amplifier 10. The first pair of bipolar transistors $1a$ and $1b$ and the second pair of bipolar transistors $3a$ and $3b$ are generally designated by reference numerals 1 and 3, respectively. The emitters of the first transistor pair 1 and those of the second transistor pair 3 are respectively joined together. An input signal Vi applied to an input signal terminal 4 is fed through respective resistors 5 and 6 having the value of $R_1$ to the respective joined emitters of the first and second transistor pairs 1 and 3. A control voltage Vc from a control input terminal 2 is supplied to the bases of the transistors $1b$ and $3b$, the bases of the transistors $1a$ and $3a$ being connected to ground. Constant current sources 7 and 8 supply and derive a constant current I to and from the joined emitters of the first and second transistor pairs 1 and 3 from power supply terminals 71 (+B) and 81 (−B), respectively. The collectors of the transistors $1a$ and $3b$ are coupled together and connected to ground, on the other hand, the collectors of the transistors $1b$ and $3a$ are connected to an inverting input terminal of the operational amplifier 10, the non-inverting input terminal thereof being grounded. A feedback resistor 9 having a value of $R_2$ is connected between the inverting input terminal and the output terminal of the operational amplifier 3. In this circuit, at a signal output terminal 11 an output voltage Vo is derived which is converted from a current iy derived from the connection point of the collectors of the transistors $1b$ and $3a$.

In the conventional gain-controlled amplifier with such a circuit configuration, the following relation is recognized between each emitter current, $i_1$, $i_2$, $i_3$ and $i_4$ of the respective transistors $1a$, $1b$, $3a$ and $3b$ and the control voltage Vc, when taken into account of the characteristics of PN junction of transistor.

$$i_2 = i_1 \cdot \exp(-K \cdot Vc) \atop i_3 = i_4 \cdot \exp(-K \cdot Vc) \Bigg\} \quad (1)$$

where $K = q/kT$, k represents a Boltzman's constant, q represents an electronic charge value, and T represents junction temperature. Assuming that the voltage Vi of the input signal applied to the input terminal 4 is larger than each base-emitter voltage of the transistors $1a$, $1b$, $3a$ and $3b$, the following equation may be derived $$i_1 + i_2 = I + \frac{v_i}{R_1} \atop i_3 + i_4 = I - \frac{v_i}{R_1} \Bigg\} \quad (2)$$

By combining the two above equations together, $i_2$ and $i_3$ are given by $$i_2 = \frac{1 + \frac{v_i}{R_1}}{\exp(K \cdot V_c) + 1} \atop i_3 = \frac{I - \frac{v_i}{R_1}}{\exp(K \cdot V_c) + 1} \Bigg\} \quad (3)$$

The current iy which is derived from either the transistors $1b$ or the transistor $3a$ and delivered to the operational amplifier 10 may be expressed by $$iy = i_2 - i_3 \quad (4)$$

By substituting the equation (3) into the equation (4), then $$iy = \frac{2v_i}{R_1 \{\exp(K \cdot V_c) + 1\}} \quad (5)$$

The output voltage Vo appearing at the signal output terminal 11 may be expressed as $$V_0 = -iy \cdot R_2 \quad (6)$$

By substituting the equation (5) into the equation (6), then $$V_0 = \frac{-2v_i \cdot R_2}{R_1 \{\exp(K \cdot V_c) + 1\}} \quad (7)$$

Therefore, the voltage gain Av of the gain-controlled amplifier shown in FIG. 1 is $$Av = \frac{-2R_2}{R_1 \{\exp(K \cdot V_c) + 1\}} \quad (8)$$

From the above equation (8), it is understood that the voltage gain Av varies exponentially with the control voltage Vc, provided that the value of $\exp(K \cdot Vc)$ in the divisor is larger than 1, that is, the control voltage Vc is larger than 0.

The gain-controlled amplifier with this circuit configuration, however, have some disadvantages in that (1) distortion, particularly due to even order harmonics, is generated which originates from the difference of the conductivity type between the transistor pairs 1 and 3, and in that (2) only in the region of Vc>0, the gain Av is controlled exponentially with the control voltage Vc, and if the Vc 22 0, the gain Av is not controlled exponentially with the control voltage Vc due to the negligible amount of $\exp(K \cdot Vc)$ compared with the value of 1 in the divisor.

SUMMARY OF THE INVENTION

It is, therefore, a principal object of the present invention to provide a novel gain-controlled amplifier in which distortion, particularly even order harmonics, is reduced by employing the same conductivity type transistors which impart an exponential gain characteristic with respect to the linear level variation of a control voltage applied thereto to the to the amplifier.

It is still another object of the present invention to provide the gain-controlled amplifier as above in which a control voltage for the control of the amplifier gain can be used either in positive or in negative with respect to ground potential.

In a preferred example of the present invention which will be described hereinunder in detail, the gain-controlled amplifier whose gain is controlled by a control voltage applied thereto comprises first and second transistor pairs, a driver circuit, a negative feedback circuit and a subtraction circuit. The first transistor pair comprises first and second transistors of the same conductivity type, and the second transistor pair comprises third and fourth transistors of the same conductivity type. The bases of the first and third transistors are joined together, and the bases of the second and fourth transistors are also joined together, across both joined bases the control voltage being supplied. The emitters of the first and second transistors and those of the third and fourth transistors are respectively joined together. The driver circuit is provided for driving oppositely in phase each of the joined emitters of the first and second transistor pairs in accordance with an input signal of the amplifier. The negative feedback circuit is provided for effecting a negative feedback to an input side of th driver circuit in accordance with a difference of the collector currents between the respective first and third transistors. The subtraction circuit is provided for delivering an output signal of the amplifier corresponding to a difference of the collector currents between the respective second and fourth transistors.

The foregoing and other objects, the features and the advantages of the present invention will be pointed out in, or apparent from, the following description of the preferred embodiments considered together with the accompanying drawings.

DETAILED DESCRIPTION OF THE PREFERRED EMBODIMENTS

Figure 2:
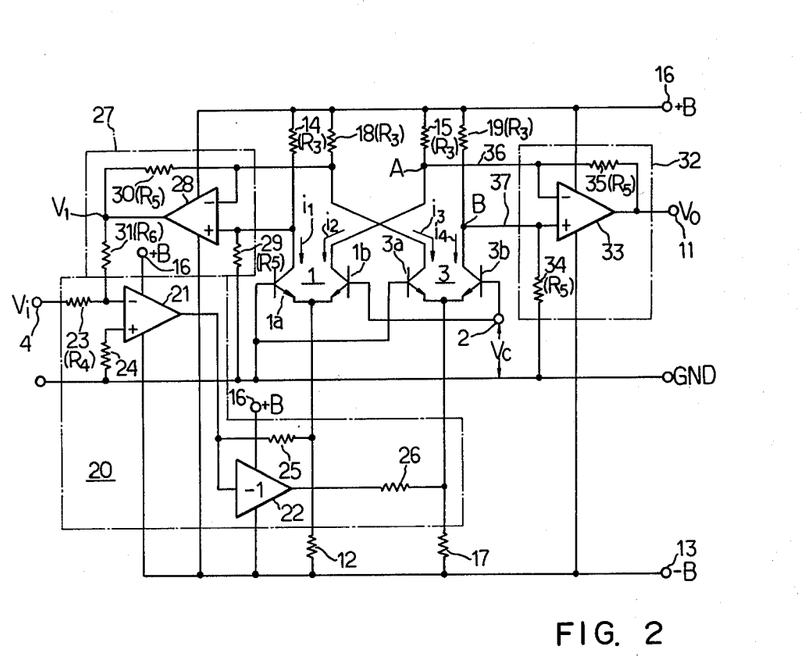
FIG. 2 is a schematic circuit diagram of a first embodiment of the gain-controlled amplifier according to the present invention.

FIG. 2 shows a circuit diagram of a first embodiment of the gain-controlled amplifier according to the invention. In FIG. 2, a first transistor pair is generally designated at 1, and a second transistor pair is generally designated at 3. The first and second transistor pairs 1 and 3 function to impart an exponential function characteristic to a signal to be amplified in accordance with a control voltage Vc.

The first transistor pair 1 comprises a first transistor 1a and a second transistor 1b respectively of an NPN transistor, the emitters being joined together and connected through a resistor 12 to a negative power supply terminal 13, and the collectors being connected through respective load resistors 14 and 15 having the same value of R3 to a positive power supply terminal 16. The base of the transistor 1a is connected to ground, and the base of the transistor 1b is connected to a control input terminal 2.

The second transistor pair 3 comprises a third transistor 3a and a fourth transistor 3b which are of the same conductivity type as those of the transistors 1a and 1b, that is, of an NPN type respectively, the emitters being joined together and connected through a resistor 17 to the negative power supply terminal 13, and the collectors being connected to the positive power supply terminal 16 through respective load resistors 18 and 19 having the same value of R3. The base of the transistor 3a is connected to ground, and the base of the transistor 3b is connected to the control input terminal 2. A control voltage having a value of Vc relative to ground is applied to the control input terminal 2, a negative power source voltage $-B$ is supplied to the negative power supply terminal 13 and a positive power source voltage $+B$ is supplied to the positive power supply terminal 16.

There is further provided a driver circuit 20 which drives each of the joined emitters of the first and second transistor pairs 1 and 3. The driver circuit 20 makes each of the joined emitters drive in opposite phase relation to each other in response to an input signal having a voltage value of Vi supplied to the signal input terminal 4. The driver circuit 20 comprises an operational amplifier 21 and an inverter 22 having a gain of $-1$. The operational amplifier 21 has an inverting input terminal connected through a resistor 23 having a value of R4 to the signal input terminal 4, a non-inverting input terminal connected to ground through a resistor 24, and an output terminal connected through a resistor 25 to the joined emitters of the first transistor pair 1 and also to an input terminal of the inverter 22. The output terminal of the inverter 22 is connected to the joined emitters of the transistor pair 3 through a resistor 26.

A feedback circuit 27 comprising an operational amplifier 28 is provided for effecting a negative feedback to the input side of the operational amplifier 21 in accordance with the difference of the collector currents of the first and third transistors 1a and 3a. A non-inverting input terminal of the operational amplifier 28 is connected to the collector of the transistor 1a and to ground through a resistor 29 having a value of R5, while an inverting input terminal of the operational amplifier 28 is connected to the collector of the transistor 3a and through a resistor 30 having a value of R5 to an output terminal of the operational amplifier 28. This output terminal is connected to the inverting input terminal of the operational amplifier 21 through a resistor 31 having a value of R6.

A subtraction circuit 32 comprising an operational amplifier 33 is provided for generating at a signal output terminal 11 an output voltage Vo which corresponds to the difference of the collector currents of the second and fourth transistors 1b and 3b. The operational amplifier 33 has an inverting input terminal connected to the collector of the transistor 1b, and a non-inverting input terminal connected to the collector of the transistor 3b and also to ground through a resistor 34 having a value of R5. An output terminal of the operational amplifier 33 is connected to the signal output terminal 11 and to the inverting input terminal of the operational amplifier 33 through a resistor 35 having a value of R5.

The operation of the embodiment thus constructed will be described below. A brief description of the circuit operation will first be given. The driver circuit 20 drives the joined emitters of the transistor pair 1 in opposite phase relation to the input signal of a voltage value V1, and also drives the joined emitters of the transistor pair 3 in the same phase relation thereto. As a result, the respective collector currents of the transistors 1a and 3a varies in opposite relation to each other with the change of the voltage Vi, this being also the case with the collector currents of the transistors 1b and 3b. In this case, the ratio of the collector current of the transistor 1a to the collector current of the transistor 1b changes exponentially with the control voltage Vc, and so the ratio of the collector current to the transistor 3a to the collector current of the transistor 3b. The difference of the collector currents between the transistors 1a and 3a is fed back to the input signal through the feedback circuit 27, and the difference of the collector currents of the transistors 1b and 3b is detected by the subtraction circuit 32 and converted to the output voltage Vo at the output terminal 11.

The above operation will be explained in more detail by using mathematical analysis. Taking the collector currents of the transistors 1a, 1b, 3a and 3b as $i_1$, $i_2$, $i_3$ and $i_4$, respectively, a relation between the collector currents and the control voltage Vc may be expressed as $$i_1 = i_2 \cdot e^{-K \cdot V_c} \quad (9)$$

$$i_3 = i_4 \cdot e^{-K \cdot V_c} \quad (10)$$

Under consideration of the characteristics of operational amplifiers, the voltage $V_1$ of the output terminal of the operational amplifier 28 may be expressed as $$V_1 = (i_3 - i_1) \cdot R_5 \quad (11)$$

It may be assumed that no current flows into the inverting input terminal which is considered as a virtual ground of the operational amplifier 21. Therefore, the amount of currents flowing through the resistor 23 and through the resistor 31 is equal to each other, and hence a relation between the voltage Vi and the voltage $V_1$ is obtained $$\frac{V_i}{R_4} = \frac{-V_1}{R_6} \quad (12)$$

$$V_i = \frac{-R_4}{R_6} \cdot V_1$$

From the nature of operational amplifiers, the voltage of the output signal appearing at the signal output terminal 11 is expressed as $$V_0 = (i_2 - i_4) \cdot R_5 \quad (13)$$

The voltage gain Av of the gain-controlled amplifier of this embodiment is $$A_v = \frac{V_0}{V_i} = \frac{(i_2 - i_4) \cdot R_5}{-\frac{R_4}{R_6} (i_3 - i_1) \cdot R_5} \quad (14)$$

$$= \frac{R_6}{R_4} \cdot \frac{(i_4 - i_2)}{(i_3 - i_1)}$$

$$= \frac{R_6}{R_4} \cdot \frac{(i_4 - i_2)}{(i_3 - i_1)} \cdot \frac{1}{e^{-K \cdot V_c}}$$

$$= \frac{R_6}{R_4} \cdot e^{K \cdot V_c}$$

From the above embodiment, the following advantages accompanied by this invention may be enumerated as:

(1) since the transistor pairs 1 and 3 use the same conductivity type transistors and are matched to one another, the operation of the transistors 1a and 3a, and the operation of the transistors 1b and 3b are considered as operating substantially symmetrically. Thus, distortion such as even order harmonics is not generated. This effect is enhanced further by the provision of the feedback circuit 27 which effects a negative feedback to the input signal.

Figure 3:
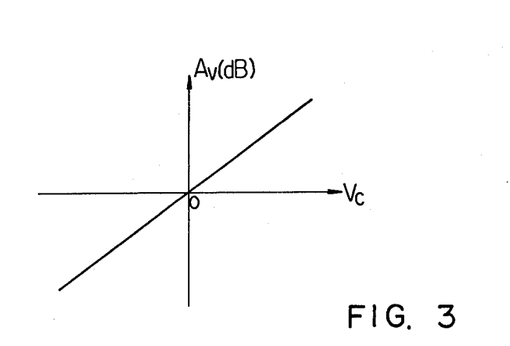
FIG. 3 is a graph showing a relation of a control voltage Vc and a voltage gain Av (dB) of the gain-controlled amplifier.

(2) as seen from the equation (14), the voltage gain Av can be exponentially changed with either a positive control voltage or a negative control voltage. The relation of the control voltage Vc and the voltage gain Av is shown in FIG. 3 which illustrates an exponential relation in both ranges covering positive and negative control voltages.

(3) the phase of the output signal appearing at the output signal terminal 11 can be easily changed by interchanging the connection points A and B of the signal input line 36 and 37 of the subtraction circuit 32 with each other.

Figure 4:
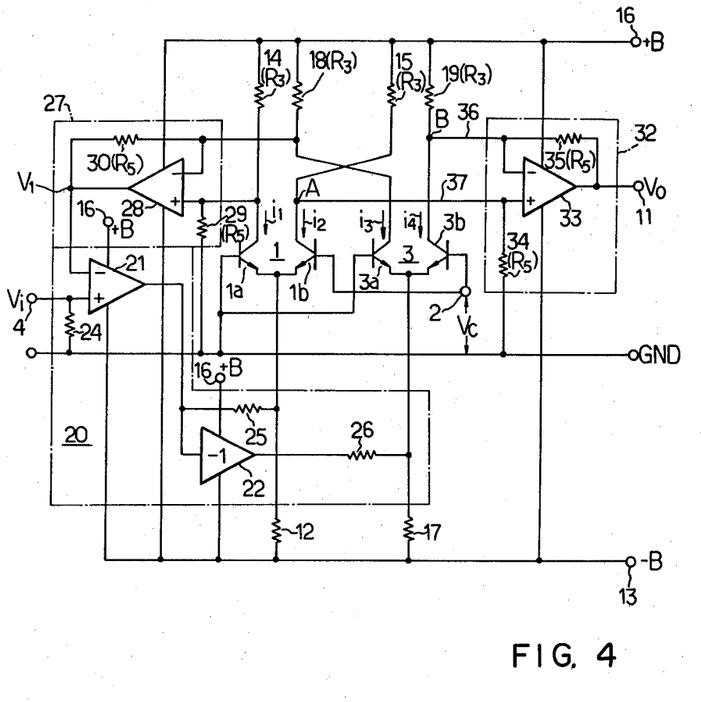
FIG. 4 is a schematic circuit diagram of a second embodiment of the gain-controlled amplifier according to the present invention.

FIG. 4 shows a circuit arrangement of a second embodiment of the gain-controlled amplifier according to the invention, which has a higher input impedance than that of the first embodiment. In FIG. 4, identical reference numerals and characters have been used to designate corresponding parts of FIG. 2 and the description thereof has been omitted for the purpose of brevity. The second embodiment differs from the first embodiment in the input circuit configuration of the operational amplifier 21 of the driver circuit 20, in the output circuit configuration of the operational amplifier 28 of the feedback circuit 27, and in the connection of the input signal lines 36 and 37 of the subtraction circuit 32.

In the driver circuit 20, a non-inverting input terminal of the operational amplifier 21 is connected to a signal input terminal 4 and to ground through a resistor 24. In the feedback circuit 27, an output terminal of the operational amplifier 28 is connected to an inverting input terminal of the operational amplifier 28 through a resistor 30, and further connected directly to an inverting input terminal of the operational amplifier 21 of the driver circuit 20. In the subtraction circuit 32, an inverting input terminal of the operational amplifier 33 is connected to the collector of the transistor 3b through the signal input line 36, and a non-inverting input terminal of the operational amplifier 33 is connected to the collector of the transistor 1b through the signal input line 37.

With such a construction, the driver circuit 20 drives the joined emitters of the transistor pair 1 in the same phase relation to the input signal voltage Vi, and drives the joined emitters of the transistor pair 3 in opposite phase relation thereto. The operation of the second embodiment will be described by using mathematical analysis. Similarly to the equations (9) and (10) described in the first embodiment, the relation between each collector current of the transistors 1a, 1b, 3a and 3b and the control voltage Vc may be expressed as $$\left.\begin{array}{l}i_1 = i_2 \cdot e^{-K \cdot V_c} \\ i_3 = i_4 \cdot e^{-K \cdot V_c}\end{array}\right\} \quad (15)$$

The output voltage $V_1$ of the operational amplifier 28 is given by $$V_1 = (i_3 - i_1) \cdot R_5 \quad (16)$$

Since the operational amplifier 21 and the inverter 22 drive the joined emitters of the transistor pairs 1 and 3 to make the voltage Vi equal to the voltage $V_1$, the folloing equation is established $$V_1 = (i_3 - i_1) \cdot R_5 = V_i \quad (17)$$

The output signal voltage Vo is given by $$V_0 = (i_4 - i_2) \cdot R_5 \quad (18)$$

then, the voltage gain Av of the gain-controlled amplifier of the second embodiment may be expressed by using the equations (15) to (18)

$$A_v = \frac{V_0}{V_i} = \frac{(i_4 - i_2) \cdot R_5}{(i_3 - i_1) \cdot R_5}$$

$$= \frac{(i_4 - i_2)}{(i_4 - i_2) \cdot e^{-K \cdot V_c}}$$

$$= e^{K \cdot V_c}$$

The above equation clearly indicates that the voltage gain Av is exponentially changed with the control voltage Vc. The gain-controlled amplifier according to the second embodiment can enjoy the similar advantages accompanied by the first embodiment together with the high input impedance characteristic.

Figure 5:
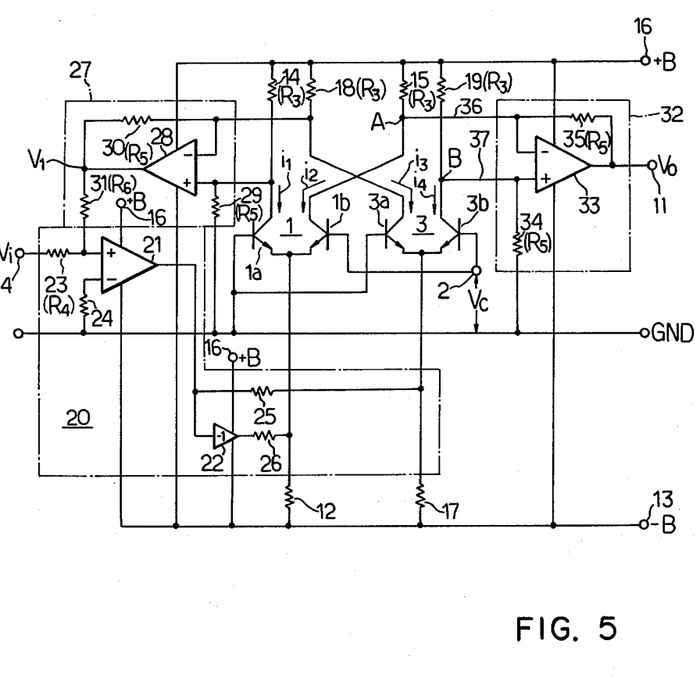
FIGS. 5 and 6 are schematic circuit diagrams of modified examples of the first and second embodiments shown respectively in FIGS. 2 and 4.

FIG. 5 shows a circuit diagram of a slightly modified example of the first embodiment shown in FIG. 2. Similar reference numerals have been used to designate corresponding parts of FIG. 2 and the description thereof has been omitted for the purpose of brevity.

The modified embodiment shown in FIG. 5 slightly differs from the first embodiment in the circuit arrangement of the driver circuit 20: An inverting input terminal of the operational amplifier 21 is connected to ground through the resistor 24, and a non-inverting input terminal thereof is connected to the signal input terminal 4 through the resistor 23 and to the output terminal of the operational amplifier 28 through the resistor 31. The output terminal of the operational amplifier 21 is connected through the resistor 25 to the joined emitter of the second transistor pair 3, and is connected through the inverter 22 and resistor 26 to the joined emitter of the first transistor pair 1.

With this circuit arrangement, the joined emitter of the first transistor pair 1 is driven in opposite phase relation to the input signal Vi, and the other joined emitter of the second transistor pair 3 is driven in the same phase relation to the input signal Vi. Therefore, similar operation to the first embodiment will also be carried out in this modified embodiment.

Figure 6:
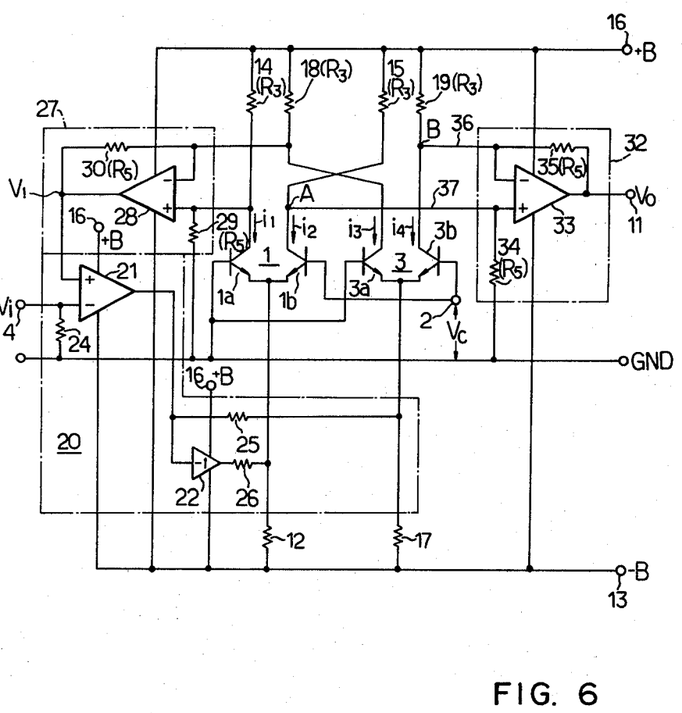

FIG. 6 shows a circuit diagram of a slightly modified example of the second embodiment shown in FIG. 4. Similar reference numerals have been used to designate corresponding parts of FIG. 4 and the description thereof has been omitted for the purpose of brevity.

The modified embodiment shown in FIG. 6 slightly differs from the second embodiment in the circuit arrangement of the driver circuit 20: A non-inverting input terminal of the operational amplifier 21 is connected to the output terminal of the operational amplifier 28, and an inverting input terminal of the operational amplifier 21 is connected to the signal input terminal 4 and to ground through the resistor 24. The output terminal of the operational amplifier 21 is connected through the resistor 25 to the joined emitter of the second transistor pair 3, and is connected through the inverter 22 and resistor 26 to the other joined emitter of the first transistor pair 1.

With this circuit arrangement, the joined emitter of the first transistor pair 1 is driven in the same phase relation to the input signal Vi, and the other joined emitter of the second transistor pair 3 is driven in opposite phase relation to the input signal Vi. Therefore, similar operation to the second embodiment will also be carried out in this modified embodiment with the high input impedance characteristic.

While there have been shown and described specific embodiments of the present invention, it will be obvious to those skilled in the art that various changes and modification may be made without departing from the invention in its broader aspects; and, therefore, it is intended that the appended claims cover all such changes and modifications as fall within the true spirit and scope of the invention.

What is claimed is:

1. A gain-controlled amplifier whose gain is controlled by a control voltage applied thereto comprising:
    an input signal terminal for receiving an input signal;
    a first bipolar transistor pair having first and second transistors of same conductivity types each transistor having a base, an emitter, and a collector, both emitters being joined together to form a first joined emitter;
    a second bipolar transistor pair having third and fourth transistors of said same conductivity types each transistor having a base, an emitter, and a collector, both emitters being joined together to form a second joined emitter;
    drive circuit means coupled between said input signal terminal and said first and second joined emitters for amplifying said input signal applied to said input signal terminal and driving said first and second joined emitters in opposite phase to each other;
    first signal generating means for generating a first signal representing a current difference between collector currents of said first and third transistors;
    second signal generating means for generating a second signal representing a current difference between collector currents of said second and fourth transistors;

negative feedback circuit means for negative-feeding back one of outputs of sad first and second signal generating means to an input side of said drive circuit means; and output signal circuit means coupled to derive the other of outputs of said first and second signal generating means therefrom as an output signal of said gain-controlled amplifier;

said bases of said first and third transistors being joined together to form a first control voltage input terminal;

said bases of said second and fourth transistors being joined together to form a second control voltage input terminal;

said control voltage being applied across said first and second control voltage input terminals;

said first joined emitter being driven in an opposite phase in relation to said first signal from said negative feedback circuit means; and said second joined emitter being driven in a same phase in relation to said first signal from said negative feedback circuit means.

2. A gain-controlled amplifier whose gain is controlled by a control voltage applied thereto comprising:
an input signal terminal for receiving an input signal;
a first bipolar transistor pair having first and second transistors of said conductivity types each transistor having a base, an emitter, a collector, both emitters being joined together to form a first joined emitter;
a second bipolar transistor pair having third and fourth transistors of said same conductivity types each transistor having a base, an emitter, a collector, both emitters being joined together to form a second joined emitter;
drive circuit means coupled between said input signal terminal and said first and second joined emitters for amplifying said input signal applied to said input signal terminal and driving said first and second joined emitters in opposite phase to each other;
first signal generating means for generating a first signal representing a current difference between collector currents of said first and third transistors;
second signal generating means for generating a second signal representing a current difference between collector currents of said second and fourth transistors;
negative feedback circuit means for negative-feeding back one of outputs of said first and second signal generating means to an input side of said drive circuit means;
output signal circuit means coupled to derive the other of outputs of said first and second signal generating means therefrom as an output signal of said gain-controlled amplifier;
said bases of said first and third transistors being joined together to form a first control voltage input terminal;
said bases of said second and fourth transistors being joined together to form a second control voltage input terminal; and
said control voltage being applied across said first and second control voltage input terminals.

3. A gain-controlled amplifier according to claim 1 or 2, wherein
said drive circuit means comprises means for generating two output signals of opposite phases to each other as an output signal of said drive circuit means;
said two output signals from said drive circuit means being applied to said first and second joined emitters, respectively.

4. A gain-controlled amplifier according to claim 3, wherein
one of said two output signals from said drive circuit means has the same phase as said input signal applied to said input signal terminal; and
the other of said two output signals from said drive circuit means has the opposite phase to said input signal applied to said input signal terminal.

5. A gain-controlled amplifier according to claim 1 or 2, wherein
said drive circuit means comprises a first operational amplifier for amplifying said input signal applied to said input signal terminal, and a second operational amplifier for inverting-amplifying an output signal of said first operational amplifier,
the output of said first operational amplifier being applied to one of said first and second joined emitters, and the output of said second operational amplifier being applied to the other of said first and second joined emitters.

6. A gain-controlled amplifier according to claim 5, wherein
said first signal generating means comprises a third operational amplifier having an inverting input terminal coupled to the collector of said third transistor, a non-inverting input terminal coupled to the collector of said first transistor, and an output terminal coupled to the input side of said drive circuit means; and
said second signal generating means comprises a fourth operational amplifier having an inverting input terminal coupled to one of the collectors of said second and fourth transistors, non-inverting input terminal coupled to the other of the collectors of said second and fourth transistors, and an output terminal coupled to said output signal circuit means.

7. A gain-controlled amplifier according to claim 6, wherein
said first operational amplifier comprises an inverting input terminal coupled to said input signal terminal and to the output terminal of said third operational amplifier, a non-inverting input terminal coupled to ground, and an output terminal coupled to an input of said second operational amplifier,
the outputs of said first and second operational amplifiers being applied to said first and second joined emitters, respectively.

8. A gain-controlled amplifier according to claim 6, wherein
said first operational amplifier comprises an inverting input terminal coupled to the output terminal of said third operational amplifier, a non-inverting input terminal coupled to said input signal terminal, and an output terminal coupled to an input of said second operational amplifier,
the outputs of said first and second operational amplifiers being applied to said first and second joined emitters, respectively.

9. A gain-controlled amplifier according to claim 6, wherein
said first operational amplifier comprises a non-inverting input terminal coupled to the output of said third operational amplifier and to said input signal terminal, an inverting input terminal coupled to ground, and an output terminal coupled to an input of said second operational amplifier, the outputs of said first and second operational amplifiers being applied to said second and first joined emitters, respectively.

10. A gain-controlled amplifier according to claim 6, wherein said first operational amplifier comprises a non-inverting input terminal coupled to the output terminal of said third operational amplifier, an inverting input terminal coupled to said input signal terminal, and an output terminal coupled to an input of said second operational amplifier, the outputs of said first and second operational amplifiers being applied to said second and first joined emitters, respectively.

* * * * *